United States Patent
Bernstein et al.

[19]

[11] Patent Number: 5,998,996

[45] Date of Patent: Dec. 7, 1999

[54] CORRECTION OF ARTIFACTS CAUSED BY MAXWELL TERMS IN PHASE CONTRAST ANGIOGRAPHY

[75] Inventors: Matthew A. Bernstein, Waukesha; Xiaohang Zhou, Pewaukee; Kevin F. King, New Berlin; Alexander Ganin, Whitefish Bay, all of Wis.; Gary H. Glover, Stanford; Norbert J. Pelc, Los Altos, both of Calif.; Jason A. Polzin, Lake Mills, Wis.

[73] Assignee: General Electric Company, Waukesha, Wis.

[21] Appl. No.: 08/826,183

[22] Filed: Mar. 27, 1997

[51] Int. Cl.⁶ ........................................ G01V 3/00
[52] U.S. Cl. ............................ 324/309; 324/307
[58] Field of Search ...................... 324/307, 309

[56] References Cited

U.S. PATENT DOCUMENTS

| | | | |
|---|---|---|---|
| 4,591,789 | 5/1986 | Glover et al. | 324/307 |
| 4,698,591 | 10/1987 | Glover et al. | 324/307 |
| 4,870,361 | 9/1989 | Kleef et al. | 324/309 |
| 4,950,994 | 8/1990 | Glover et al. | 324/320 |
| 5,226,418 | 7/1993 | Bernstein et al. | 600/419 |

OTHER PUBLICATIONS

Minimizing TE in Moment–nulled or Flow–encoded Two–and Three–dimensional Gradient–Echo Imaging, JMRI, vol. 2, No. 5, pp. 583–588, Sep. 1992, Bernstein, et al.

*Primary Examiner*—John Barlow
*Assistant Examiner*—Paul A. LaViolette
*Attorney, Agent, or Firm*—Quarles & Brady, LLP

[57] ABSTRACT

A method is presented for correcting Maxwell term error artifacts produced by an NMR system during the production of either a phase contrast angiogram or a complex difference angiogram. Phase corrections are made to the reconstructed phase image to eliminate the artifacts. Correction coefficients calculated from the flow encoding magnetic gradient waveforms of the phase contrast pulse sequence are used in a polynomial to calculate a set of phase error corrections. These corrections are then used to adjust the phase at each pixel of the angiogram image.

7 Claims, 5 Drawing Sheets

CORRECTION OF ARTIFACTS CAUSED BY MAXWELL TERMS IN PHASE CONTRAST ANGIOGRAPHY

BACKGROUND OF THE INVENTION

The field of the invention is nuclear magnetic resonance imaging methods and systems. More particularly, the invention relates to the correction of image artifacts caused by "Maxwell terms" produced by gradient fields in MRI systems.

When a substance such as human tissue is subjected to a uniform magnetic field (polarizing field $B_0$), some of the individual magnetic moments of the spins in the tissue align with this polarizing field. The spins also precess about the polarizing field at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When exciting and receiving these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

It is well known that imperfections in the linear magnetic field gradients ($G_x$, $G_y$, $G_z$) produce artifacts in the reconstructed images. It is a well known problem, for example, that eddy currents produced by gradient pulses will perturb the magnetic fields and produce image artifacts. Methods for compensating for such eddy current errors are also well known as disclosed, for example, in U.S. Pat. Nos. 4,698,591; 4,950,994; and 5,226,418.

It is also well known that the gradients may not be perfectly uniform over the entire imaging volume, which may lead to image distortion. Methods for compensating this non-uniformity are well known, and for example, are described in U.S. Pat. No. 4,591,789.

Other than uncompensated eddy current errors and gradient non-uniformity errors that escape correction, it can be assumed that the magnetic field gradients ($G_x$, $G_y$, $G_z$) produce linear magnetic fields exactly as programmed, thus spatially encoding the NMR data accurately. With these gradients, the overall static magnetic field at location (x,y,z) is conventionally given as $B_0 + G_x x + G_y y + G_z z$, and the direction of the field is usually thought to be along the z-axis. This description, however, is not exactly correct. As long as a linear magnetic field gradient is applied, the overall magnetic field is nutated away from the z-axis and its amplitude exhibits higher-order spatial dependencies ($x^2$, $y^2$, $z^2$, $z^3$, ...). These phenomena are a direct consequence of the Maxwell equations which require that the overall magnetic field satisfy the following two conditions: $\vec{\nabla} \cdot \vec{B} = 0$ and $\vec{\nabla} \times \vec{B} = \vec{0}$. (The last equation, involving the curl of $\vec{B}$ is valid in regions where there is no true or displacement current density, which is approximately true within the object being imaged.) The higher-order magnetic fields, referred to as "Maxwell terms" (or Maxwell fields), represent a fundamental physics effect, and are not related to eddy currents or imperfection in hardware design and manufacture. Although Maxwell terms have been known for at least a decade, their effect on imaging has been largely ignored because of their minute consequence under conventional imaging conditions.

Phase contrast magnetic resonance angiograms depict vasculature by imaging flowing blood. The detection of the flowing blood relies upon the fact that an NMR signal produced by spins flowing through a magnetic field gradient experiences a phase shift which is proportional to velocity. For flow that has a roughly constant velocity during the measurement cycle the change in phase of the NMR signal is given as follows:

$$\phi = \gamma M v$$

where M is the first moment of the magnetic field gradient, $\gamma$ is the gyromagnetic ratio and v is the velocity of the spins along the direction of the gradient. To eliminate errors in this measurement due to phase shifts caused by other sources, it is common practice to perform the measurement at least twice with different magnetic field gradient moments as described in U.S. Pat. No. 4,609,872. The difference in phase at any location between the two measurements is then as follows:

$$\Delta\phi = \gamma \Delta M v$$

By performing two complete scans with different magnetic field gradient first moments and subtracting the measured phases in the reconstructed image, a phase map is produced which accurately measures the velocity of constantly moving spins. The accuracy of the phase map, and hence the accuracy of the angiogram, is directly related to the magnetic fields that are produced. It is known that phase errors produced by higher-order spatial gradients that necessarily result when linear magnetic field gradients are applied, can produce significant artifacts in phase contrast angiograms.

SUMMARY OF THE INVENTION

The present invention relates to the reconstruction of phase contrast magnetic resonance angiograms, and particularly, to the elimination or reduction of image artifacts in such images caused by the Maxwell terms. In one embodiment correction coefficients are calculated based on the gradient waveforms employed in the pulse sequence, and these coefficients are used to calculate phase corrections in the angiogram reconstructed from the data acquired with the pulse sequence. In another embodiment, Maxwell terms are eliminated by altering the pulse sequence such that an anti-symmetric bipolar motion encoding gradient is used and this is applied during an interval of the pulse sequence during which no other gradients are applied.

A general object of the invention is to eliminate artifacts in phase contrast images caused by Maxwell terms. By calculating phase corrections based on the applied pulse sequence gradients and correcting the reconstructed phase contrast image therewith, image artifacts are eliminated without any increase in the echo time (TE) of the pulse sequence. In the alternative, when a longer echo time (TE) is acceptable, the pulse sequence can be adjusted to reduce or eliminate the Maxwell artifacts.

GENERAL DESCRIPTION OF THE INVENTION

The Maxwell terms are basically the higher-order spatial gradients (second order, third order, etc.) produced by the applied linear magnetic field gradients (x, y and z-gradients). These terms can be directly derived from the Maxwell equations. According to the Maxwell equations, a magnetic field $\vec{B}$ must satisfy the following two conditions:

$$\vec{\nabla} \cdot \vec{B} = 0 \quad \text{(divergence equation)}, \tag{1a}$$

$$\vec{\nabla} \times \vec{B} = \mu_0 \varepsilon_0 \frac{\partial \vec{E}}{\partial t} + \mu_0 \vec{J} \quad \text{(curl equation)}, \tag{1b}$$

where $\vec{\nabla}$ is the derivative operator ($\vec{\nabla} \equiv \hat{i}\partial/\partial x + \hat{j}\partial/\partial y + \hat{k}\partial/\partial z$), $\vec{E}$ is the electric field, $\vec{J}$ is the current density, and $\mu_0$ and $\epsilon_0$ are the magnetic permeability and the electric permittivity of the free space, respectively. If there is no current density and the electric field is static, equation 1b reduces to:

$$\vec{\nabla} \times \vec{B} = \vec{0}. \tag{1c}$$

From equations 1a and 1c, we obtain:

$$\frac{\partial B_x}{\partial x} + \frac{\partial B_y}{\partial y} + \frac{\partial B_z}{\partial z} = 0, \tag{2}$$

$$\frac{\partial B_x}{\partial y} = \frac{\partial B_y}{\partial x}, \tag{3a}$$

$$\frac{\partial B_y}{\partial z} = \frac{\partial B_z}{\partial y}, \tag{3b}$$

$$\frac{\partial B_z}{\partial x} = \frac{\partial B_x}{\partial z}. \tag{3c}$$

The above 4 equations 2 and 3a–c contain a total of 9 partial derivatives, among which only 5 are independent. Our next task is to select these five independent variables. Recognizing that $$\frac{\partial B_z}{\partial x} \equiv G_x, \quad \frac{\partial B_z}{\partial y} \equiv G_y, \quad \frac{\partial B_z}{\partial z} \equiv G_z$$

($G_x$, $G_y$, and $G_z$ are the linear gradients), we can readily choose $G_x$, $G_y$, and $G_z$ as the first three independent variables. For a radially symmetric $G_z$-field in cylindrical coordinates $\partial B_x/\partial x$ and $\partial B_y/\partial y$ should be identical. However, to cover a more general case, we choose a dimensionless symmetry parameter $\alpha$ as the fourth independent variable:

$$\alpha \equiv -\frac{\partial B_x/\partial x}{G_z}, \text{ or } 1-\alpha \equiv -\frac{\partial B_y/\partial y}{G_z}. \tag{4a-b}$$

The last independent variable can be conveniently chosen as (based on equation 3a):

$$g \equiv \frac{\partial B_x}{\partial y} = \frac{\partial B_y}{\partial x} \tag{5}$$

At this point, all the partial derivatives described in equations 2 and 3 can be expressed using the 5 independent variables $G_x$, $G_y$, $G_z$, $\alpha$ and g:

$$\begin{bmatrix} \frac{\partial B_x}{\partial x} & \frac{\partial B_x}{\partial y} & \frac{\partial B_x}{\partial z} \\ \frac{\partial B_y}{\partial x} & \frac{\partial B_y}{\partial y} & \frac{\partial B_y}{\partial z} \\ \frac{\partial B_z}{\partial x} & \frac{\partial B_z}{\partial y} & \frac{\partial B_z}{\partial z} \end{bmatrix} = \begin{bmatrix} -\alpha G_z & g & G_x \\ g & -(1-\alpha)G_z & G_y \\ G_x & G_y & G_z \end{bmatrix}. \tag{6}$$

With all the terms, the overall magnetic field becomes:

$$\vec{iB} = +e,\text{cir} + i\, i + ee\, B_x + +e,\text{cir} + i\, j + ee\, B_y + +e,\text{cir} + i\, k + ee\, B_z, \tag{7}$$

where, to first order, $$\begin{bmatrix} B_x \\ B_y \\ B_z - B_0 \end{bmatrix} = \tag{8}$$

$$\begin{bmatrix} \frac{\partial B_x}{\partial x} & \frac{\partial B_x}{\partial y} & \frac{\partial B_x}{\partial z} \\ \frac{\partial B_y}{\partial x} & \frac{\partial B_y}{\partial y} & \frac{\partial B_y}{\partial z} \\ \frac{\partial B_z}{\partial x} & \frac{\partial B_z}{\partial y} & \frac{\partial B_z}{\partial z} \end{bmatrix} \begin{bmatrix} x \\ y \\ z \end{bmatrix} = \begin{bmatrix} -\alpha G_z & g & G_x \\ g & -(1-\alpha)G_z & G_y \\ G_x & G_y & G_z \end{bmatrix} \begin{bmatrix} x \\ y \\ z \end{bmatrix}.$$

The above equations have two important implications. First, the $B_0$-field is no longer aligned along the z-axis because of the transverse fields $B_x$ and $B_y$. Second, the amplitude of the $B_0$ field is not simply given by $B=B_0+G_xx+G_yy+G_zz$, but instead by $$B(x,y,z) = \sqrt{B_x^2 + B_y^2 + B_z^2} \tag{9}$$

($B_0+G_xx+G_yy+G_zz$ merely represents the z-component of the overall field). If we perform three sequential Taylor series expansions on equation 9 with respect to x, y, and z, respectively, it can be seen that the magnetic field not only has its regular zeroth and first order spatial dependencies, but also shows higher-order spatial components. The result of the Taylor expansion to the second order is given by equation 10:

$$B = B_0 + G_x x + G_y y + G_z z + \frac{1}{2B_0}[\alpha^2 G_z^2 + g^2]x^2 + \qquad (10)$$

$$\frac{1}{2B_0}[(1-\alpha)^2 G_z^2 + g^2]y^2 + \frac{1}{2B_0}[G_x^2 + G_y^2]z^2 + \frac{gG_z}{B_0}xy +$$

$$\frac{1}{B_0}[gG_x - (1-\alpha)G_y G_z]yz + \frac{1}{B_0}[gG_y - \alpha G_x G_z]xz.$$

(The Taylor expansion needs to be carried out to a sufficiently high order to obtain the result in equation (10). For example, the term $G_x X + G_y Y + G_z Z)^2$ is canceled by an equal and opposite term from the second order.) For gradient systems used in most MRI systems, we have g=0, and $\alpha \approx \frac{1}{2}$ (due to the cylindrical symmetry). Under these conditions, equation 10 is simplified to:

$$B = B_0 + G_x x + G_y y + G_z z + \frac{1}{8B_0}G_z^2 x^2 + \frac{1}{8B_0}G_z^2 y^2 + \qquad (11)$$

$$\frac{1}{2B_0}[G_x^2 + G_y^2]z^2 - \frac{1}{2B_0}G_y G_z yz - \frac{1}{2B_0}G_x G_z xz.$$

If the MR system in question does not have cylindrical symmetry, then the appropriate values of g and $\alpha$ can be used in equation 10 instead.

Equations 10 and 11 indicate that, whenever a linear magnetic field gradient is applied, higher-order gradient fields will be produced to satisfy the Maxwell equations. These higher-order gradient fields are referred to as the "Maxwell terms", or "Maxwell fields."

With the inclusion of the Maxwell terms, the NMR signal equation becomes:

$$S(k_x, k_y) = \int\int_{x,y} \rho(x,y)e^{-i(k_x x + k_y y)}e^{-i\phi_M} dx dy, \qquad (12a)$$

$$\phi_M = \gamma \int_t B_M(G_x, G_y, G_z, x, y, z) dt', \qquad (12b)$$

$$B_M = \frac{1}{8B_0}G_z^2 x^2 + \frac{1}{8B_0}G_z^2 y^2 + \qquad (12c)$$

$$\frac{1}{2B_0}[G_x^2 + G_y^2]z^2 - \frac{1}{2B_0}G_y G_z yz - \frac{1}{2B_0}G_x G_z xz.$$

where $B_M$ is the Maxwell higher-order terms of the magnetic field and $\phi_M$ is the associated phase error, which we call the "Maxwell phase". As implied by equation 12, the Maxwell phase error depends on the details of each pulse sequence. In some pulse sequences, the phase error can be zero and thus cause no image degradation. In most other sequences, a non-zero phase error is produced, which can cause various image quality problems such as shading, which is particularly important in phase contrast MRA. It should be apparent that equation (12a) can readily be extended to 3D imaging if necessary.

A phase contrast image can be produced by acquiring two phase images, $\phi_{fe1}(x,y,z)$ and $\phi_{fe2}(x,y,z)$, and subtracting them:

$$\Delta\phi_M(x,y,z) = \phi_{fe1}(x,y,z) - \phi_{fe2}(x,y,z), \qquad (13)$$

The first phase image employs a bipolar, motion encoding gradient having a first moment $M_1$ and the second image is acquired using a bipolar, motion encoding gradient having a first moment $M_2$, with $M_1 - M_2 = \Delta M$. In practice the phase difference operation is accomplished with the following mathematical operation:

$$\Delta\phi(x,y,z) = arg\left(\frac{Z_{fe1}}{Z_{fe2}}\right) = arg(Z_{fe1} Z_{fe2}^*) \qquad (14)$$

where $Z_{fe1}$ and $Z_{fe2}$ are complex images reconstructed by the complex Fourier transform of the fe1 and fe2 data sets respectively, * denotes complex conjugate, and "arg" represents the phase of a complex number, i.e. $arg(z) = \tan^{-1}(Im(z)/Re(z))$.

There are two methods for reducing Maxwell phase errors caused by the application of the motion encoding gradient. The first method employs modifications to the phase contrast imaging pulse sequence to eliminate the production of Maxwell artifacts. The second method calculates the coefficients of a formula based on the gradients produced by the phase contrast imaging pulse sequence. The formula is then employed to correct the phase errors produced in the reconstructed phase difference image caused by Maxwell fields.

Correction Based on Pulse Sequence Design

Figure 4:
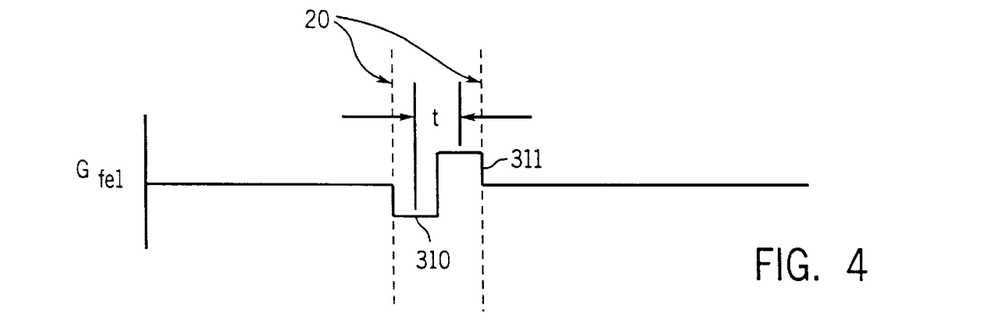
FIG. 4 is a graphic representation of a first bipolar flow encoding gradient pulse used in the pulse sequence of FIG. 3.
Figure 5:
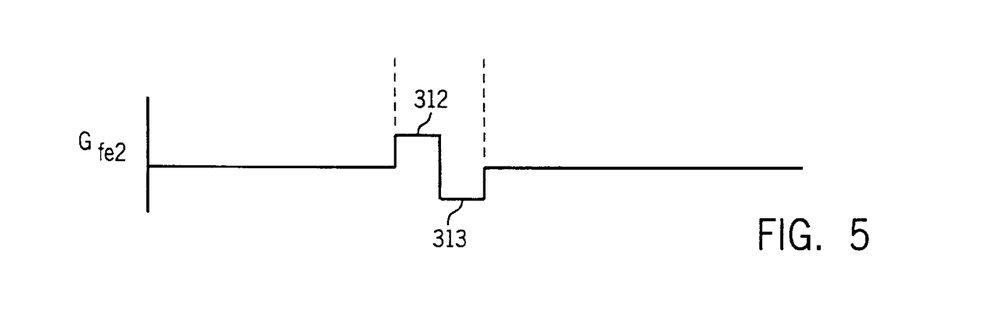
FIG. 5 is a graphic representation of a second bipolar flow encoding gradient pulse used in the pulse sequence of FIG. 3.

Equations (12c) and (13) indicate that phase errors caused by the self-squared terms (e.g. $G_x^2$, $G_y^2$, $G_z^2$) can be eliminated if the motion encoding gradients used to acquire the two subtracted phase image data sets are anti-symmetric. Such anti-symmetric motion encoding gradients $G_{fe1}$ and $G_{fe2}$ are illustrated in FIGS. 4 and 5. The anti-symmetric property means that $G_{fe1}(t) = -G_{fe2}(t)$. The motion encoding gradients illustrated in FIGS. 4 and 5 are also "bipolar", that is, each waveform consists of two equal and opposite gradient lobes. These bipolar motion encoding gradients may be directed along any one axis, x, y or z.

Equation (12c) also indicates that the cross-term errors (e.g. $G_y G_z$, $G_x G_z$) will not be produced if the bipolar motion encoding gradients are not produced concurrently with the other imaging gradient pulses. For example, a flow-compensated, gradient recalled echo, imaging pulse sequence shown in FIG. 3 may be adjusted such that the bipolar motion encoding gradient $G_{fe1}$ or $G_{fe2}$ may be inserted into the pulse sequence as shown by the dotted lines 20. Although this eliminates the cross-term Maxwell phase errors, it requires that the TE of the pulse sequence be increased substantially to play out the motion encoding gradients alone.

Figure 6:
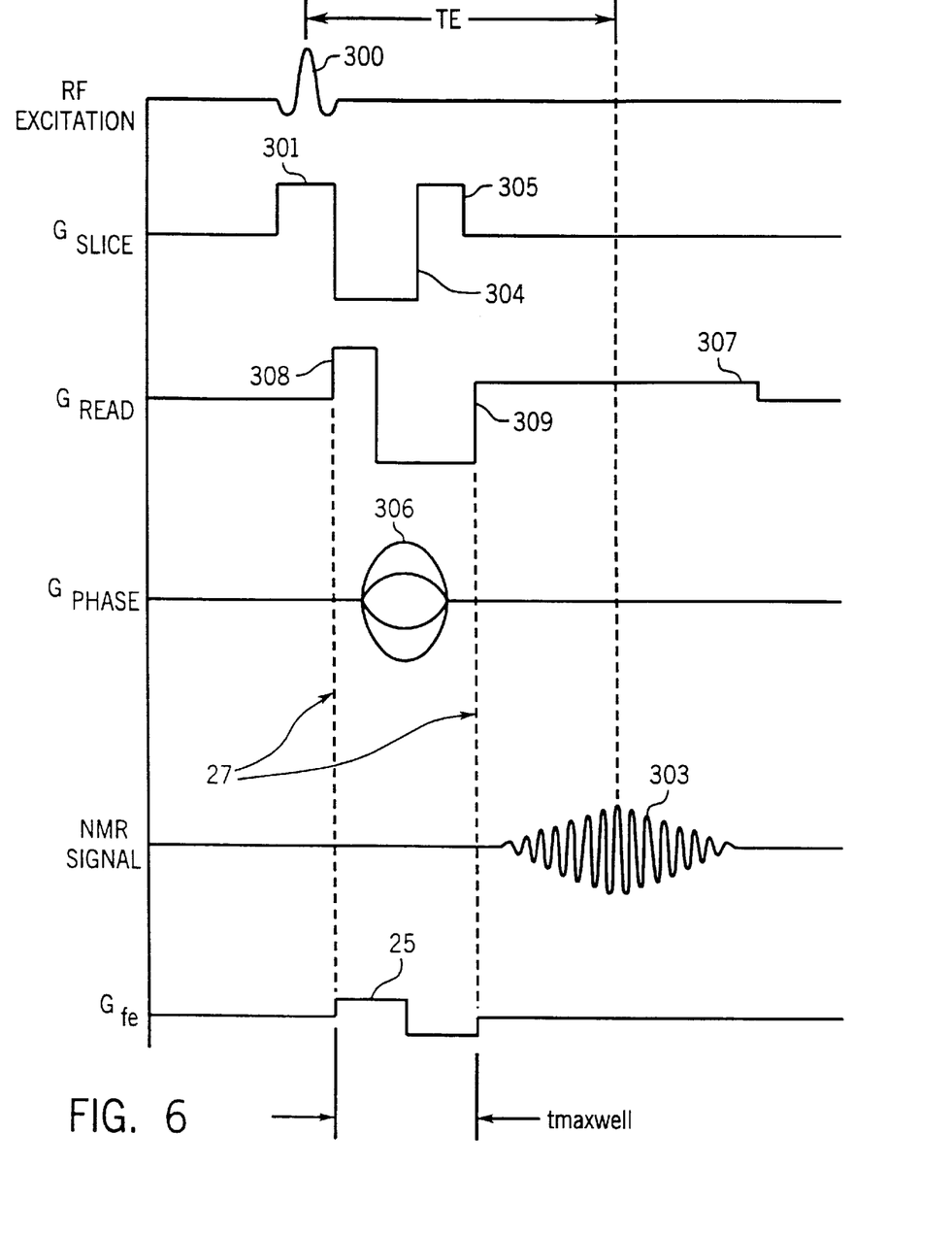
FIG. 6 is a graphic representation of an alternative pulse sequence employed in the MRI system of FIG. 1 to practice the present invention.

If a small increase in TE is acceptable, another method for reducing, but not eliminating the cross-term errors is to reduce, or derate, the amplitude of the bipolar motion encoding gradient $G_{fe1}$ and $G_{fe2}$. The gradient is increased in width to fill the time interval between the completion of the rf excitation and the beginning of the echo signal readout, and its amplitude is accordingly decreased to the value necessary to produce the desired first moments $M_1$ and $M_2$. This is illustrated in FIG. 6 where the bipolar flow encoding gradient 25 is spread out to occupy the time interval defined by dashed lines 27. A detailed description of how to combine flow encoding gradients with imaging gradients in a gradient recalled echo pulse sequence is given by Bernstein, Shimakawa, and Pelc, "Minimizing TE In Moment-Nulled or Flow-Encoded Two- and Three-Dimensional Gradient-Echo Imaging," JMRI 1992; 2:583–588. When thus combined with the image gradient(s), the combined waveform is derated as described above.

Correction Applied to Reconstructed Phase Imaging

This method corrects Maxwell term phase errors after the Fourier transform step of the reconstruction process. Since the gradients that are produced during the pulse sequence are known, the phase errors produced by the Maxwell terms can be calculated from equation (12b). The phase at each location x,y,z in the reconstructed image can then be corrected according to the following formula:

$$\Delta\phi_M(x,y,z) = A\ z^2 + B(x^2+y^2) + C\ xz + D\ yz. \quad (15)$$

The coefficients for this formula are calculated numerically using the following formulas, and the chosen pulse sequence:

$$A = \frac{\gamma}{2B_0}\int\left\{(G_x^2(t) + G_y^2(t))_{fe1} - (G_x^2(t) + G_y^2(t))_{fe2}\right\}dt \quad (16)$$

$$B = \frac{\gamma}{8B_0}\int\left\{G_z^2(t)_{fe1} - G_z^2(t)_{fe2}\right\}dt$$

$$C = -\frac{\gamma}{2B_0}\int\left\{(G_x(t)G_z(t))_{fe1} - (G_x(t)G_z(t))_{fe2}\right\}dt$$

$$D = -\frac{\gamma}{2B_0}\int\left\{(G_y(t)G_z(t))_{fe1} - (G_y(t)G_z(t))_{fe2}\right\}dt.$$

The integrals in equation (16) are evaluated over a time interval which includes all the gradient lobes that change with the motion encoding gradient. The $G_{fe1}$ and $G_{fe2}$ contributions from all remaining time intervals cancel. Usually the time interval required extends from the end of the slice selection gradient to the beginning of the readout gradient. We call this time interval "tmaxwell". In the pulse sequence of FIG. 6, for example, tmaxwell corresponds to the time interval defined by dashed lines 27. The calculated Maxwell phase error can then be expressed in terms of these calculated coefficients, and the physical spatial coordinates as set forth in Equation (15).

Under some circumstances, the coefficients in Equation (16) can be calculated analytically. For example, it is easy to show that a trapezoidal lobe with amplitude $G_o$, flat-top duration F and ramp duration r has a simple expression for its self-squared integral:

$$\int G^2(t)dt = G_0^2\left(F + \frac{2}{3}r\right) \quad [\text{trapezoidal lobe}]. \quad (17)$$

Thus the coefficients A and B have simple analytical expressions for trapezoidal lobes. Unfortunately the cross-term coefficients C and D have no such expressions and this analytical solution is not sufficient when cross-term errors must be corrected.

Generally, the integrals in equation (16) are calculated using numeric methods. This is done by building numerical arrays representing the $G_x$, $G_y$ and $G_z$ waveforms. Typically, 500 points per axis suffice to represent the waveforms over tMaxwell. The integrals in equation 16 are then approximated with discrete sums.

The coefficients A, B, C and D are calculated prior to performing the scan. When the scan is completed and the data are Fourier transformed to produce $Z_{fe1}$ and $Z_{fe2}$, the Maxwell phase error at each x,y,z location therein is calculated using equation (15). Ideally, he phase correction is then made to the image array prior to the calculation of the phase at each pixel location using the arctangent operation. The corrected phase difference image is thus calculated according to the following formula:

$$\Delta\phi_{corr}(x,y,z) = arg\left(\frac{Z_{fe1}}{Z_{fe2}}e^{-i\Delta\phi_M(x,y,z)}\right) = arg(Z_{fe1}Z_{fe2}^*e^{-i\Delta\phi_M(x,y,z)}) \quad (18)$$

By correcting the phase before the arc tangent operation the method works well even in regions where 360° phase wrap occurs.

DESCRIPTION OF THE PREFERRED EMBODIMENT

Figure 1:
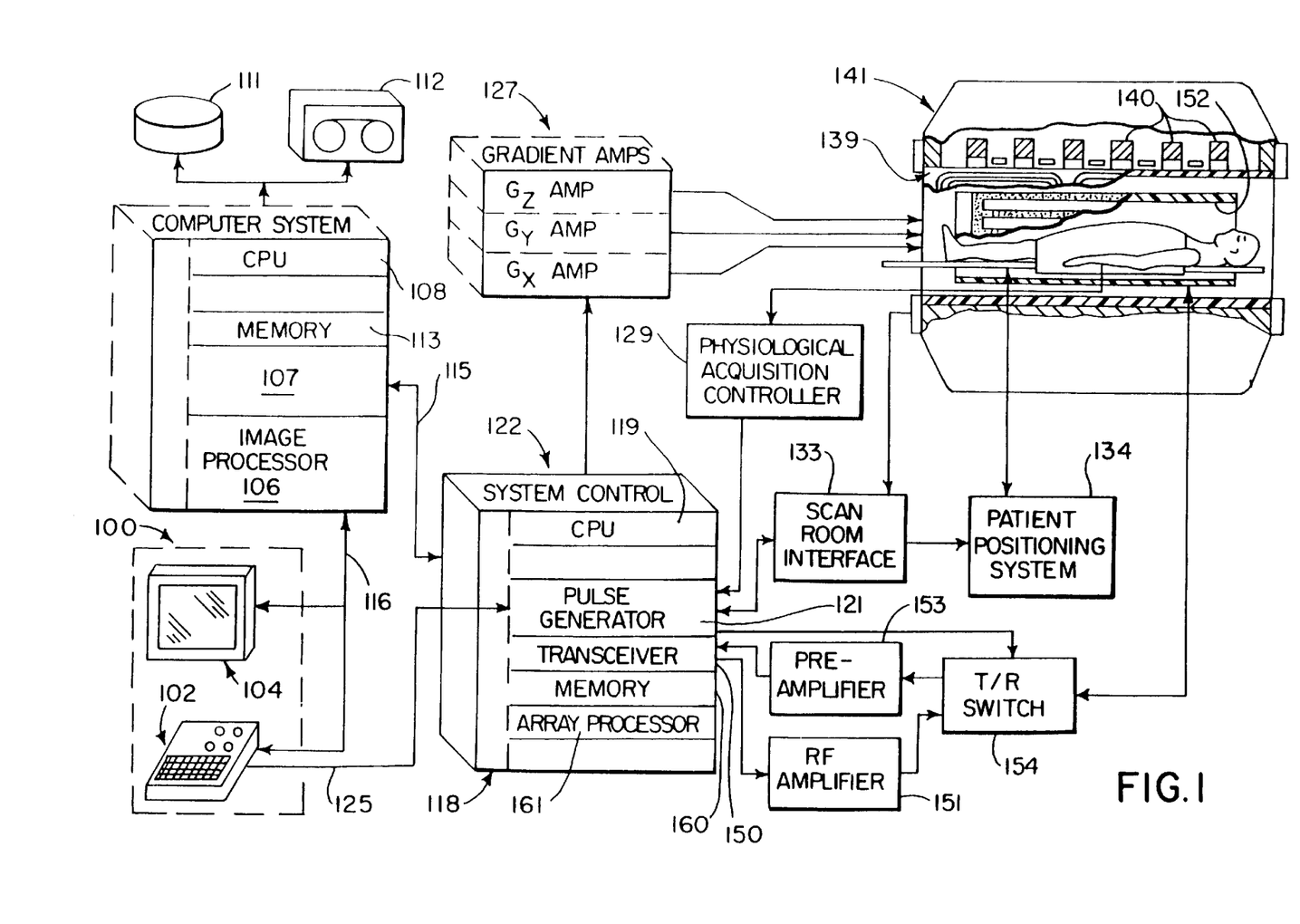
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is corrected in accordance with the teachings of the present invention and stored in the disk memory 111. Alternating, the Maxwell errors can be corrected using the array processor 161. In response to commands received from the operator console 100, this image data may be archived on the tape drive 112, or it may be further processed by the image processor 106 and conveyed to the operator console 100 and presented on the display 104.

Figure 2:
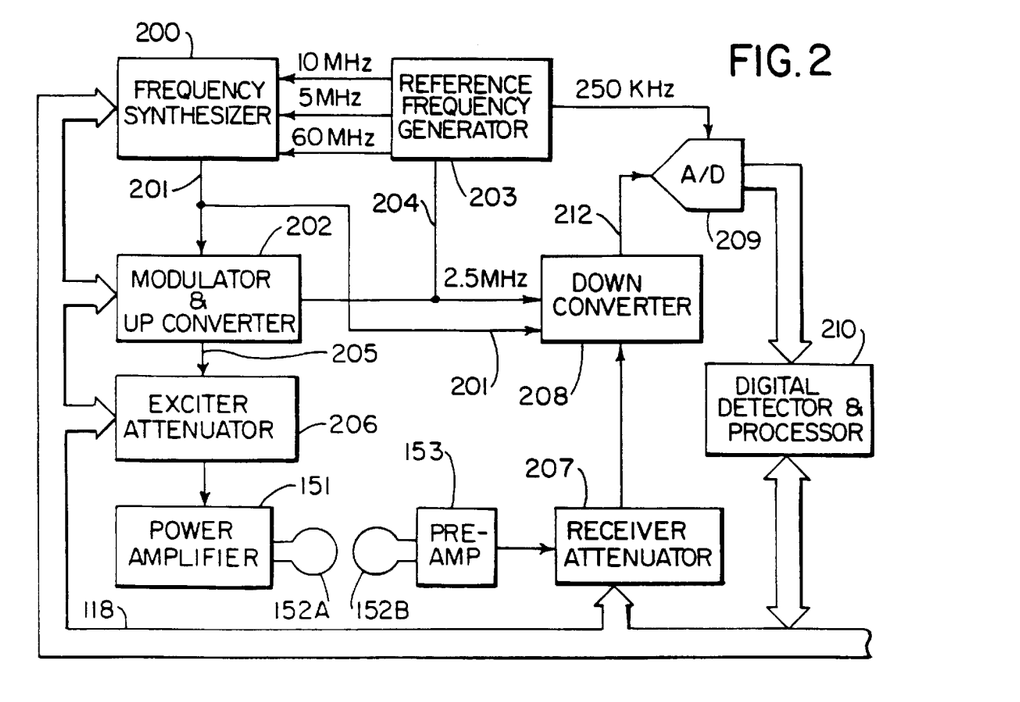
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal.

Figure 3:
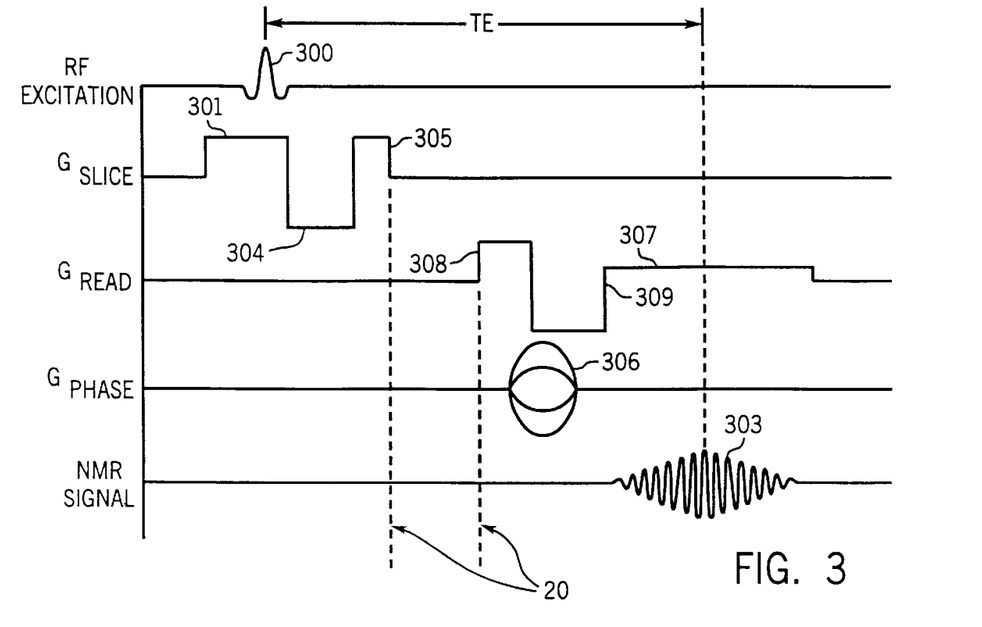
FIG. 3 is a graphic representation of a first preferred pulse sequence employed in the MRI system of FIG. 1 to practice the present invention.

The NMR system of FIG. 1 performs a series of pulse sequences to collect sufficient NMR data to reconstruct the desired angiogram. Referring particularly to FIG. 3, the first pulse sequence can be a conventional first order moment nulled gradient echo sequence in which a selective RF excitation pulse 300 is applied to the subject in the presence of a $G_{slice}$ slice select gradient pulse 301. The excitation pulse 300 has a flip angle $\alpha$ with a typical value of $\alpha$ being 30°. To compensate the FID for the phase shifts caused by the slice select gradient pulse 301 and to desensitize the FID to velocity along the z axis, a negative $G_{slice}$ gradient pulse 304 followed by a positive $G_{slice}$ gradient pulse 305 are produced by the $G_{slice}$ gradient coils. For example, one solution is to use a pulse 304 of the same width, but opposite sign, as the pulse 301, and the pulse 305 is one-half the width and the same height as the pulse 301. While the pulses 304 and 305 compensate for velocity along the z axis, more complex gradient waveforms are also well known to those skilled in the art for compensating acceleration and even higher orders of motion.

To spatially encode the NMR signal 303 a phase encoding $G_{phase}$ gradient pulse 306 is applied to the subject shortly after the application of the RF excitation pulse 300. As is well known in the art, a complete scan comprises a series of these pulse sequences in which the amplitude of the $G_{phase}$ pulse is stepped through a series of, for example, 256 discrete phase encoding values to encode the position of the spins producing the NMR signal along the y axis. Position along the x axis is encoded by a $G_{read}$ gradient pulse 307 which is produced as the NMR gradient echo signal 303 is acquired and which frequency encodes the NMR signal 303. Unlike the $G_{phase}$ phase encoding gradient pulse 306, the $G_{read}$ readout gradient pulse 307 remains at a constant value during the entire scan. To produce the gradient echo 303 and to desensitize it to velocity along the x axis, gradient pulses 308 and 309 are produced prior to the pulse 307. There are a number of well known strategies to accomplish this. It is also well known that the gradients $G_{slice}$, $G_{read}$ and $G_{phase}$ may be directed along any of the physical axes x, y and z and that for oblique scans these functional gradients may be produced by any two or even all three of the physical gradients $G_x$, $G_y$ and $G_z$.

As is explained in more detail below, to practice the present invention, at least two complete data sets, each with different flow sensitivity along one direction, are needed. In the preferred embodiment data for the two data sets are acquired in an interleaved fashion. In this approach, two or more measurements with different flow sensitivity are acquired sequentially with one value of the phase encoding gradient. The phase encoding value is then changed and additional measurements are made at this new phase encoding value with the same two or more flow sensitivities. This process continues until all the phase encoding values have been employed. The acquired data are then reordered into k-space NMR data sets, each with a different flow sensitivity. Although this interleaved approach is preferred because it minimizes effects due to other motion (e.g. respiratory), in the following discussion the invention is described as if the k-space NMR data sets are each completely acquired prior to the next flow encoding being used.

The NMR signal 303 is acquired by the system transceiver 150 and digitized into a row of, for example, 256 complex numbers which are stored in the system control memory 160 or the memory of the main computer 113. For each value of the $G_{phase}$ phase encoding gradient an NMR signal 303 is produced, acquired, digitized and stored in a separate row of 256 complex numbers. At the completion of the scan, therefore, a two-dimensional (256×256) array of complex numbers is stored in the computer 101 for each flow encoded data set.

To produce an angiogram according to the present invention the acquired NMR signals are velocity sensitized. The pulse sequence used is the same as that shown in FIG. 3, but a bipolar flow encoding gradient $G_{fe}$ is also applied. This is illustrated in FIG. 4, where $G_{fe1}$ has a bipolar waveform comprising a negative gradient pulse 310 followed by a positive gradient pulse 311. The area (A) defined by each lobe 310 and 311 is the same, and the centers of each gradient lobe 310 and 311 are spaced from one another by a time interval (t). The incremental first moment $(M_1)$ provided by the $G_{fe1}$ gradient is, therefore $M_1 = A \times t$, and this gradient first moment $M_1$ is applied after the application of the RF excitation pulse 300 and before the acquisition of the signal 303. Although the gradient $G_{fe1}$ is illustrated as a separate gradient magnetic field, in fact, it is produced by the same coils which produce the $G_{read}$, $G_{phase}$ and $G_{slice}$ gradient fields. For example, it is quite common to sensitize for flow in the slice selection direction, in which case the gradient moment $G_{ef1}$ is produced solely by the $G_{slice}$ gradient coil. Thus, in the preferred embodiment a first array of NMR raw signals $Z_1$ is acquired using the pulse sequence of FIG. 3, but with the $G_{ef1}$ gradient field of FIG. 4 added. It can also be appreciated that the flow encoding gradient is combined with the imaging gradients as described in the above-cited JMRI publication.

After the first array of NMR signals $Z_1$ has been acquired and stored, a second array of signals $Z_2$ is acquired. This is done during a scan in which the pulse sequence of FIG. 3 is employed, but the bipolar flow encoding gradient $G_{fe2}$ is applied as shown in FIG. 5 to produce a first moment of $M_2 = -M_1$. Thus the total first moment difference is $\Delta M = M_2 - M_1 = -2M_1$. This is accomplished with gradient pulse 312 and 313 which are identical, but opposite in direction to the gradient pulses 310 and 311. After the 256 NMR signals $Z_2$ have been acquired and stored in the computer 101, the data acquisition phase is completed for one axis of motion and the data processing phase is commenced.

One solution to eliminating Maxwell phase errors from the angiogram that is reconstructed from the two data sets $Z_1$ and $Z_2$ is to adjust the pulse sequence such that no Maxwell terms are produced or those that are produced are canceled during the phase difference operation. This can be accomplished in the pulse sequence of FIGS. 3–5 in two ways. First, the two bipolar flow encoding gradients $G_{fe1}$ and $G_{fe2}$ are identical, but anti-symmetric. That is, $G_{fe1}(t) = -G_{fe2}(t)$. This ensures that whatever "self-squared" Maxwell phase errors appear in the first data set $Z_1$ also appear in the second data set $Z_2$ and are subtracted out of the final phase difference angiogram image.

The second adjustment that must be made is to lengthen the pulse sequence and create a time period indicated by the dashed lines 20 during which the bipolar flow encoding gradient $G_{fe1}$ or $G_{fe2}$ can be played out alone. This precludes the production of any "cross-term" Maxwell phase errors that are otherwise produced when another gradient field is applied concurrently.

Although these adjustments to the pulse sequence can completely eliminate phase errors due to Maxwell terms, this solution comes with a performance penalty. In order to play out the bipolar flow encoding gradients separately, the echo time (TE) must be significantly increased with a consequent increase in the total scan time. For example, the echo time (TE) may be increased from 9 ms to 12 ms with a resulting 3 ms increase in minimum TR, resulting in a 10–20% increase in scan time, or decrease in temporal resolution.

The preferred method for eliminating artifacts caused by Maxwell terms employs the much shorter pulse sequence shown in FIG. 6. The same rf and gradient fields are applied and the pulses which produce them have been identified with the same reference numbers described above with reference to FIG. 3. The only significant difference is that the pulse sequence echo time (TE) has been shortened by playing out the bipolar flow encoding gradient 25 concurrently with other gradient pulses during the time period tmaxwell.

Figure 7:
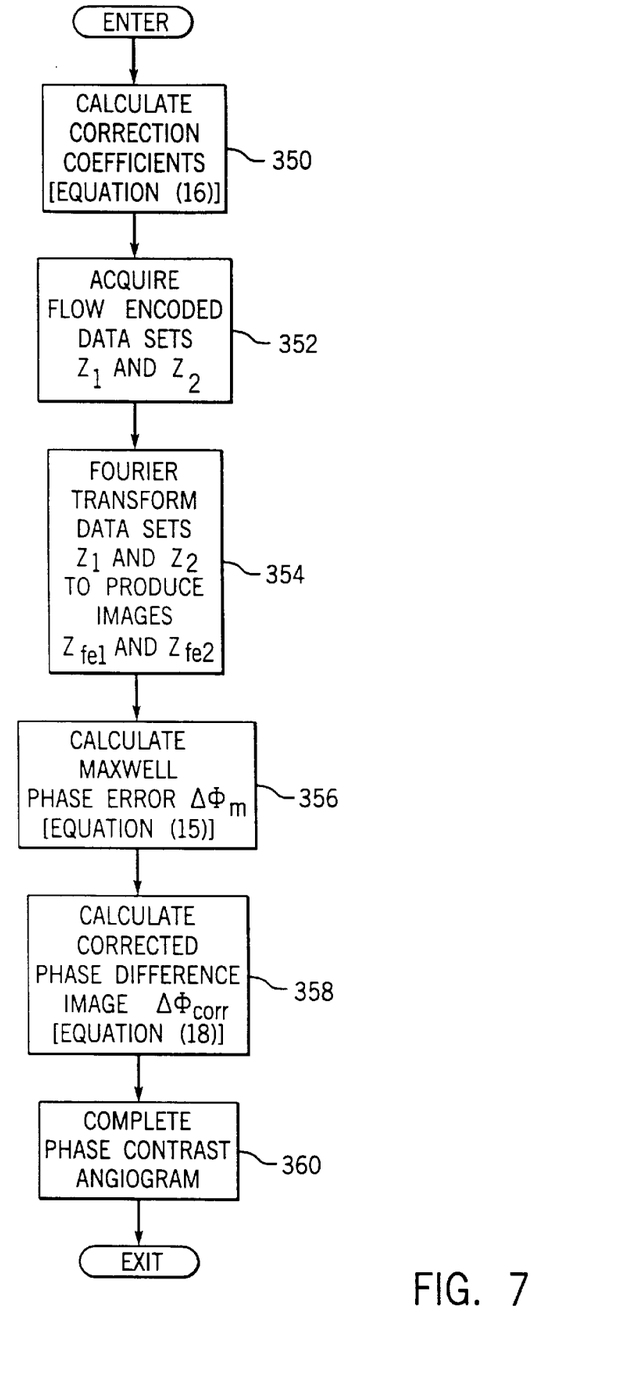
FIG. 7 is a flow chart of the method used to produce an image with data acquired using the pulse sequence of FIG. 6.

A scan performed using the pulse sequence of FIG. 6 is depicted by the flow chart in FIG. 7. After the pulse sequence parameters have been selected and the flow encoding gradient direction and size selected, the integrals in equation (16) are evaluated numerically over the time period tmaxwell as indicated by process block 350. The resulting correction coefficients A, B, C and D are stored and the data acquisition step is begun by down loading the pulse sequence to the pulse generator 121. As indicated by process block 352, the two flow encoding data sets $Z_1$ and $Z_2$ are then acquired as described above. These are Fourier transformed in the array processor 161 as indicated at process block 354 to produce the corresponding flow encoded image data sets $Z_{fe1}$ and $Z_{fe2}$. Using the stored correction coefficients A, B, C and D and equation (15), the Maxwell phase error $\Delta\phi_M$ is calculated as indicated at process block 356. Physical coordinates (x,y,z) are then determined for each pixel in the reconstructed images $Z_{fe1}$ and $Z_{fe2}$. The Maxwell phase error $\Delta\phi_M$ is then applied to each pixel. The phase errors $\Delta\phi_M$ are thus corrected first in each complex image $Z_{fe1}$ and $Z_{fe2}$, and then the arctangent function is performed on corresponding corrected pixels in these images according to equation (18). As indicated by process block 360, the phase contrast angiogram is then produced by making any further corrections for eddy current phase errors. An example of such processing is described in U.S. Pat. No. 5,226,418 which is incorporated herein by reference.

The phase correction of equation (18) may also be used to correct a complex difference (CD) angiogram. Using the law of cosines:

$$CD = \sqrt{|z_{fe1}|^2 + |z_{fe2}|^2 - 2|z_{fe1}||z_{fe2}|\cos\Delta\phi_{corr}(x, y, z)}.$$

If phase images sensitive to flow in 2 or 3 perpendicular directions are required, a separate Maxwell term correction may be applied to each phase image. Such flow encoding strategies are described in "Encoding Strategies for Three-Direction Phase-Contrast MR Imaging of Flow," by Norbert J. Pelc, Matt A. Bernstein, Ann Shimakawa, and Gary H. Glover, JMRI 1991; 1: 405–413. A Maxwell-corrected "speed" image may then be reconstructed.

$$\text{speed} = \sqrt{(\Delta\phi_{corr,x})^2 + (\Delta\phi_{corr,y})^2 + (\Delta\phi_{corr,z})^2}.$$

Similarly, a Maxwell-corrected complex difference speed image may also be produced:

$$CD_{speed} = \sqrt{CD_x^2 + CD_y^2 + CD_z^2}.$$

The present invention is compatible with phase contrast images produced using phased array multicoils as described in U.S. Pat. No. 5,399,970 and described in "Reconstruction Of Phase Contrast, Phase Array Multicoil Data" by Matt A. Bernstein, Mladen Grgic, Thomas J. Brosnan and Norbert J. Pelc: Magnetic Resonance in Medicine, 32:330–334 (1994).

We claim:

1. A method for correcting Maxwell term phase errors produced by an NMR system during the production of an angiogram using a phase contrast pulse sequence, the steps comprising:
    a) establishing operator-selected input parameters for the phase contrast pulse sequence;
    b) determining the gradient waveforms based on these parameters;
    c) calculating correction coefficients based upon the gradient waveforms active during a time period tmaxwell of the pulse sequence;
    d) acquiring two data sets $Z_1$ and $Z_2$ using the phase contrast pulse sequence with two different corresponding flow encoding gradient first moments applied during the time period tmaxwell;
    e) reconstructing two image data sets $Z_{fe1}$ and $Z_{fe2}$ from the acquired data sets $Z_1$ and $Z_2$;
    f) calculating Maxwell phase errors $\Delta\phi_M$ using the calculated correction coefficients; and
    g) producing a phase contrast angiogram from the image data sets $Z_{fe1}$ and $Z_{fe2}$ in which the phase at each pixel therein is corrected to offset the calculated Maxwell phase errors $\Delta\phi_M$.

2. The method as recited in claim 1 in which the Maxwell phase errors are calculated in step f) as follows:

$$\Delta\phi_M(x,y,z) = Az^2 + B(x^2+Y^2) + Cxz + Dyz,$$

where x,y,z are the physical coordinates of the pixel to be corrected and A, B, C and D are the calculated correction coefficients.

3. The method as recited in claim 1 in which the Maxwell phase errors $\Delta\phi_M$ calculated in step f) are employed to offset the errors in the image data sets $Z_{fe1}$ and $Z_{fe2}$ before calculating the phase difference which is used to produce the phase contrast angiogram from said image data sets.

4. The method as recited in claim 1 in which the phase contrast angiogram is produced in step g) as follows:

$$\Delta\phi_{corr}(x, y, z) = arg(Z_{fe1}(Z_{fe2}^*) e^{-i \Delta\phi_m(x,y,x)})$$

where x,y,z are the physical coordinates of the pixel, $Z_{fe2}^*$ is the complex conjugate of the image data set $Z_{fe2}$ and $\Delta\phi_M(x,y,z)$ is the Maxwell phase error at each pixel.

5. The method as recited in claim 4 in which the steps are repeated with flow encoding gradients directed along three orthogonal axes and three corrected angiograms ($\Delta\phi_{corr,x}$), ($\Delta\phi_{corr,y}$) and ($\Delta\phi_{corr,z}$) are produced and a speed image is calculated by combining the three corrected angiograms as follows:

$$\text{speed} = \sqrt{(\Delta\phi_{corr,x})^2 + (\Delta\phi_{corr,y})^2 + (\Delta\phi_{corr,z})^2}.$$

6. The method as recited in claim 4 in which a Maxwell corrected complex difference angiogram is produced as follows:

$$CD = \sqrt{|z_{fe1}|^2 + |z_{fe2}|^2 - 2|z_{fe1}||z_{fe2}|\cos\Delta\phi_{corr}(x, y, z)}.$$

7. The method as recited in claim 6 in which the steps are repeated with flow encoding gradients directed along three orthogonal axes and three corrected complex difference angiograms $(CD_x) (CD_y)$ and $(CD_z)$ are produced, a complex difference speed image is calculated by combining them as follows:

$$CD_{speed} = \sqrt{CD_x^2 + CD_y^2 + CD_z^2}.$$

* * * * *